United States Patent
Farrell et al.

(10) Patent No.: US 6,438,732 B1
(45) Date of Patent: Aug. 20, 2002

(54) METHOD AND APPARATUS FOR MODELING GATE CAPACITANCE OF SYMMETRICALLY AND ASYMMETRICALLY SIZED DIFFERENTIAL CASCODE VOLTAGE SWING LOGIC (DCVSL)

(75) Inventors: James Arthur Farrell, Harvard; Harry Ray Fair, III, Newburyport; Nevine Nassif, Arlington; Gill Watt, Acton, all of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/291,345

(22) Filed: Apr. 14, 1999

(51) Int. Cl.[7] .............................................. G06F 17/50
(52) U.S. Cl. .................... 716/4; 716/5; 716/6
(58) Field of Search .................... 716/4, 5, 6

(56) References Cited

U.S. PATENT DOCUMENTS 6,028,454 A * 2/2000 Elmasry et al. ............. 326/115
6,090,153 A * 7/2000 Chen et al. .................... 716/8

OTHER PUBLICATIONS

Adams et al, "QUAD DCVS: A Dynamic Differential Logic Family with Precharge Low and High I/O," IEEE, Mar. 1998, pp. 142–145.*

Jen et al, "A Unified Sumicrometer MOS Transistor Charge/Capacitance Model for Mixed–Signal IC's," IEEE, Jan. 1999, pp. 103–106.*

Winton et al, "A Simple, Continuous, Analytical Charge/Capacitance Model for the Short–Channel MOSFET," IEEE, Jul. 1998, pp. 631–638.*

Somasekhar et al, "Differential Current Switch Logic: A Low Power DCVS Logic Family," IEEE, Jul. 1996, pp. 981–991.*

Hirata et al, "Estimation of Propagation Delay Considering Short–Circuit Current for Static CMOS Gates," IEEE, Nov. 1998, pp. 1194–1198.*

\* cited by examiner

Primary Examiner—Matthew Smith
(74) Attorney, Agent, or Firm—Cesari and McKenna, LLP

(57) ABSTRACT

A method and apparatus for determining load capacitance of DCVSL circuits in timing verification of a circuit is disclosed in the present invention. The gate capacitances for various MOS devices are modeled based upon simulations with certain conditions for inputs to the gate, source and drain. The system then determines the existence of DCVSL circuits within the topology of a circuit, and applies one of several models to determine minimum and maximum capacitances for the encountered DCVSL structures. The determination of minimum and maximum capacitance depends upon the selected model and the capacitance of each of the MOS devices as previously calculated.

3 Claims, 6 Drawing Sheets

US 6,438,732 B1

METHOD AND APPARATUS FOR MODELING GATE CAPACITANCE OF SYMMETRICALLY AND ASYMMETRICALLY SIZED DIFFERENTIAL CASCODE VOLTAGE SWING LOGIC (DCVSL)

BACKGROUND OF THE INVENTION

1. Field of the Invention

The present invention relates to a method and apparatus for determining capacitance of a differential cascode voltage swing logic (DCVSL) for use in a timing verifier. More particularly, it relates to a method and apparatus which uses a simplified model of a structure of a DCVSL in determining the capacitance.

2. Discussion of the Related Art

Circuit verification is a significant part of analyzing a design of a circuit. It is significantly more economical to ensure that the circuit will operate as intended prior to production. Timing verification is a portion of the circuit verification process. Timing verification is used to identify all critical and race paths through a circuit. Critical paths are paths through which a signal passes more slowly than other paths. In race paths, the signals pass more quickly. Timing verification has become increasingly important for the design of CMOS circuits. As CMOS circuits on a chip have become more complex, the complexity for verifying timing has also increased. Also, as chips are designed to operate at higher speeds, timing verification must be more accurate. Thus, timing verification is a principal part of the design process for a circuit.

A variety of tools are available for timing verification. These tools involve differing speeds for verification and accuracy of the results. The most significant concern for a circuit designer in timing verification is that a timing induced functional violation will go undetected, i.e. that an error will not be found during the verification process. If a violation is missed by the timing verifier, the circuit will pass to the silicon where errors become more difficult and more costly to uncover and resolve.

One type of timing verification tool is computerized circuit simulators, such as SPICE. With SPICE, the circuit is modeled within the computer. The program simulates the operation of an entire circuit which is represented as a set of connected elements. Certain assumptions are made regarding the inputs. The program then determines the value of signals at all of the points within the circuit at time intervals. While SPICE and other circuit simulators are very accurate models of a circuit, they are extremely slow. They operate with small time segments and make many calculations to determine the signal values at the many nodes in a circuit. This slow speed inhibits their use as a timing verification tool for an entire circuit. Therefore, other timing verification tools have been created which use simpler models of a circuit. These other tools provide much faster speeds, with a loss of accuracy. Since accuracy decreases with such tools, a circuit designer will often use the simpler, quicker tools just to determine potential critical or race paths, or paths which may induce a functional violation. Once certain paths are identified, they will be checked more accurately using SPICE, or a similar circuit simulator, to determine whether any changes need to be made to the circuit.

With a timing verification tool, it is most important not to miss any violations. A missed violation will result in an erroneous circuit, which may not be detected until much later. However, the number of false violations should be minimized. As the number of detected violations increases, the time to accurately check each detected violation also increases. With many false violations being reported by the timing verifier, the time for checking the circuit becomes needlessly large. Therefore, a need exists for a timing verification tool which quickly and accurately estimates minimum and maximum delay times, while erring on the pessimistic side in order to insure that no violations are missed.

Traditionally, the delays through MOSFETs can be calculated by treating them as a resistance-capacitance (RC) structure. By using a model of the corresponding RC structure for a MOS device, the Miller capacitance can be used to determine the maximum and minimum values for delays. The Miller capacitance is used because it is easy to calculate and represent a worst case scenario. However, the difference between capacitances and delays using such models differs significantly from actuality. Such inaccuracies result in large numbers of false violations which need to be checked. Therefore, a need exists for a timing verification tool which more accurately reflects delays and capacitances within the circuit.

Furthermore, when two or more gates of MOS devices are on a single trace, the capacitances of each device are summed to determine the maximum capacitance as seen at the trace. This summing further compounds the errors when certain structures are involved. In particular, the capacitance of differential cascode voltage swing logic (DCVSL) circuits, which include multiple devices on a single trace, are severely miscalculated. A DCVSL circuit, as illustrated in FIG. 1, includes two MOS devices 1, 2 on a single trace 3. When the total capacitance is determined according to conventional practice, both devices are treated as having source/drain pairs which are either rising or falling. However, with the DCVSL structure, one MOS device will have a rising source/drain pair while the other has a falling source/drain pair. It is impossible for both pairs of source/drain nodes to switch in a direction opposite to the input signal. Additionally, the rising source/drain pair passes a reduced charge due to the body effect. Therefore, a need exists for a timing verifier which more accurately identifies the capacitances of a DVCSL structure and can more accurately determine timing.

Of course, greater accuracy could be obtained by simply including the entire circuit in the analysis and using a circuit simulator. However, this type of timing analysis would be extremely slow, which is impractical for a timing verifier seeking to quickly determine potential problems in a circuit design.

SUMMARY OF THE INVENTION

The present invention overcomes many of the deficiencies of the existing timing verifiers by more accurately calculating capacitance of each of the MOS devices in a circuit. In accordance with the present invention, the capacitance of the MOS devices is determined based upon a variety of potential inputs to each of the terminals, gate, source and drain. The capacitance at the gates of each of these devices may then be used, in combination, to determine a load capacitance for the DCVSL circuit. By using calculated capacitances and simplified models of DCVSL circuits, the timing verifier can determine a load for the DCVSL circuit fairly quickly.

According to one embodiment, a simplified model for the DCVSL circuit operates to account for the complementary switching behavior of such circuits. According to this model, one of the MOS devices has a source/drain pair which switches in the same direction as the input voltage, and the other MOS device has a source/drain pair which switches in the opposite direction. For symmetrically sized DCVSL circuits, it does not matter which pair is assumed to switch in either direction. For asymetrically sized circuits, the first simplified model switches the device with the larger width opposite in the direction to input signal for determining maximum capacitance and in same direction of the input signal for determining minimum capacitance. The smaller width device has its source/drain pair switching in the opposite direction to that of the larger device.

According to a second embodiment, a second model of DCVSL devices is used. In the second model, the source/drain pair of only one of the MOS devices is switched when the input has switched, which accounts for the possible overlap current due to time delays. The non-switching device is assumed to be connected to VDD or VSS, depending on the behavior of the switching device. For example, with an NMOS DCVSL, the model has one device with its source/drain pair falling and other device tied low, since the logical state it would eventually switch to is high. Again for an NMOS DCVSL device, the model determines the minimum capacitance by having one source/drain pair rising, and the other pair tied high, since it would eventually switch to low. The body effect may also be accounted for on one side of the switching device because one source/drain node could have complementary logic to insure a good voltage output level. Only one node needs to be body effected. With asymmetrically sized DCVSL circuits, the second embodiment uses the larger device as the switching source/drain pair.

DETAILED DESCRIPTION

Figure 1:
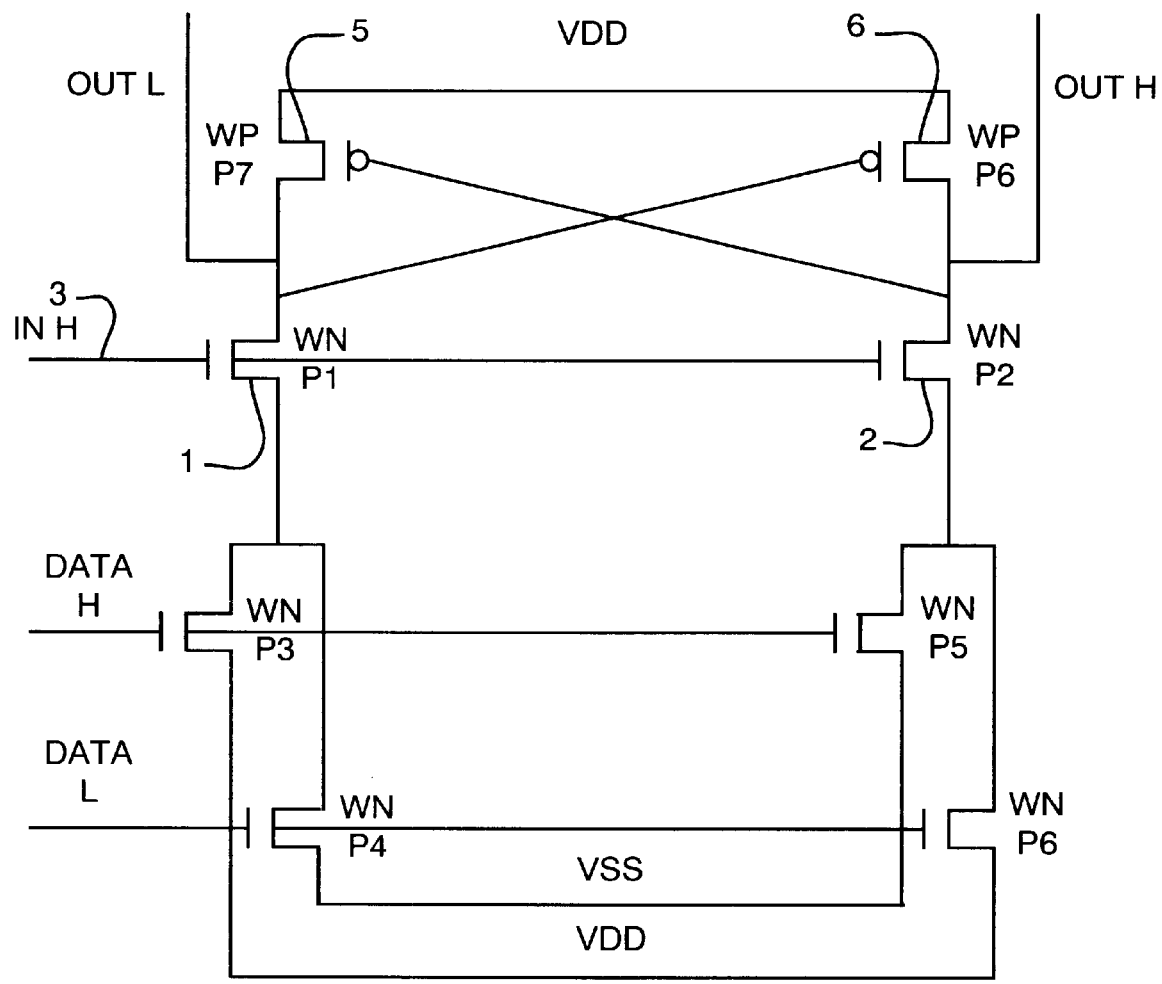
FIG. 1 illustrates the structure of a DCVSL device.
Figure 2:
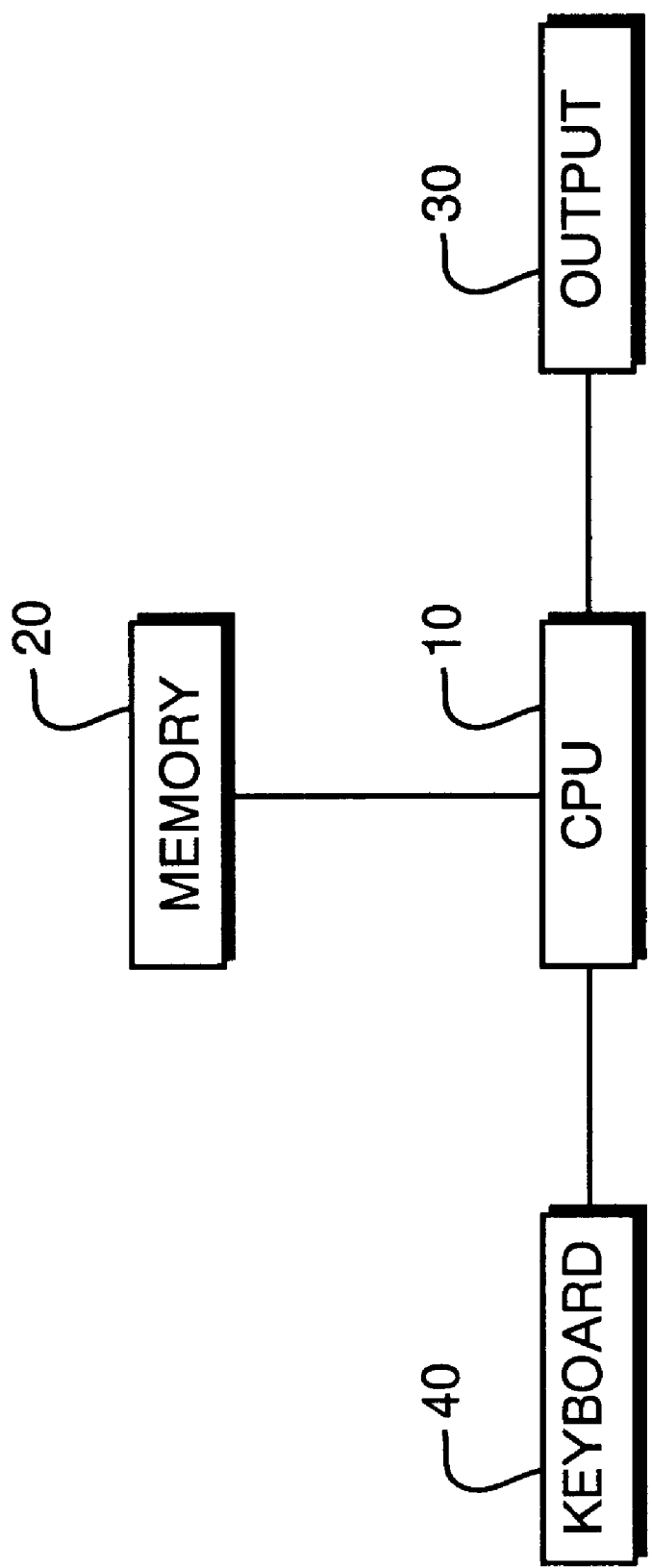
FIG. 2 illustrates a hardware structure which can be used to implement the present invention.

FIG. 2 represents hardware which can be used to implement the present invention. The hardware corresponds to the elements of a general purpose computer. Of course, these elements could be replaced with a special purpose computer or equivalent hardware and software elements for carrying out the processes of the present invention as discussed below. As illustrated in FIG. 1, hardware can include a central processing unit (CPU) 10 which executes digital instructions. Instructions are stored and retrieved from a memory 20 connected to the CPU 10. In addition to instructions, the memory 20 stores data used and processed by the CPU 10 in executing the instructions. A keyboard 40 is connected to the CPU 10 in order to input data or other information which can be stored in the memory 20 or used by the CPU 10. This system includes an output 30 also connected to the CPU 10. The output 30 can be of a variety of types depending upon the subsequent processing necessary for the output. For example, the output can include a display, a printer, a disk drive, or other elements for outputting magnetic or electronic information.

Figure 3:
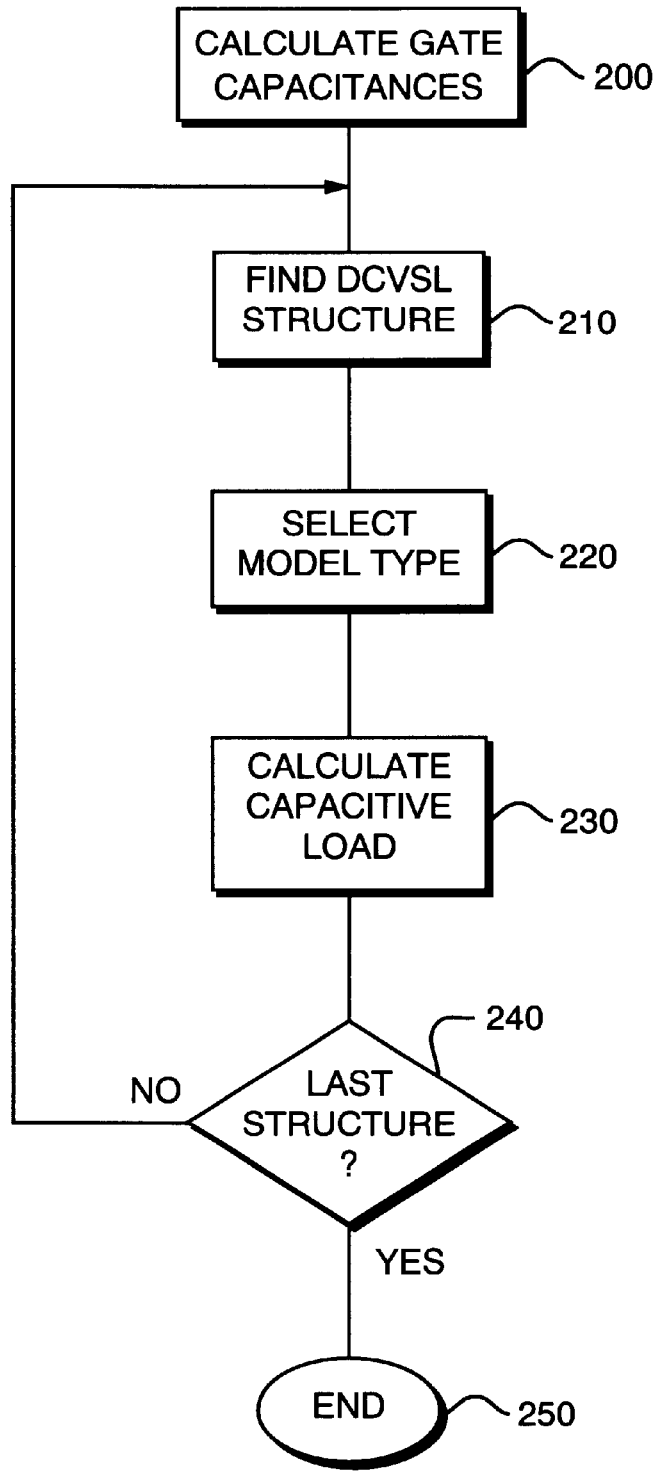
FIG. 3 is a block flow diagram representing operation of the present invention.

FIG. 3 illustrates the process for determining the load of the DCVSL circuit within a larger chip. At step 200, the gate capacitances for different types of MOS devices are determined. The capacitance at the gate depends upon the signals on all of the gate, the source and the drain. In determining gate capacitances in step 200, different signals at the gate, the source and the drain can be considered. In particular, in order to determine the load on a DCVSL, the gate capacitances need to be determined for a specific set of signals. Specifically, the capacitances are determined with both the source and drain rising, falling, being held to VSS, and being held to VDD. The capacitances under each of these conditions are determined with a rising gate input and a falling gate input.

According to a related invention, which is the subject of a patent application entitled "Method and Apparatus for Determining Charges on a CMOS Circuit Within a Static Timing Verifier", filed on even date herewith and incorporated herein by reference, accurate models can be created for determining gate capacitances for a variety of different circuit configurations. These configurations include the ones set forth above which are necessary to determine the gate load of a DCVSL circuit. The related application discloses a system for determining capacitances within a timing verifier. When such a system is used in a timing verifier, the individual gate capacitances necessary for determining the capacitance of the DCVSL circuit are known within the timing verifier.

As discussed in greater detail in the related application, the gate capacitances are determined by running a variety of simulations using SPICE, or a similar circuit simulation program, in order to determine data points for charges in MOS devices, having different widths and lengths, within different circuit configurations. A curve fitting technique is used with the data points to determine a model for the different capacitances of MOS devices under different conditions. The simulations are run using anticipated parameters of the chip being considered, such as the temperature and signal patterns. The models can then be used with all MOS devices on a chip in order to determine individual capacitances. With respect to the present invention, the models can be used to determine capacitances of MOS devices within the DCVSL circuit. The capacitances for the MOS device can then be combined with the present invention to determine the gate capacitance for the entire circuit. Of course, other methods could be used for determining the gate capacitances for the individual MOS devices within a DCVSL circuit in conjunction with the present invention.

At step 210, the circuit description is reviewed in order to determine the existence of DCVSL type circuits. In particular, the system looks through the circuit description to determine a pair of PMOS devices 4, 5 (FIG. 1) having their gates and drains connected or a pair of cross-coupled inverters. The system then compares the structures below the PMOSs, or inverters, for complementary topologies. If such a structure is encountered, the gate capacitances of the input line IN_H, and data lines DATA_H and DATA_L (FIG. 1) are determined according to the following steps illustrated in FIG. 3. At step 220, a model for the DCVSL is selected. The models are illustrated in FIGS. 4, 5A, 5B, 6A and 6B. The selection of a model depends upon the desired accuracy in analyzing the circuit characteristics of the circuit and the characteristics of each of the MOS devices connected to the input line IN_H.

Figure 4:
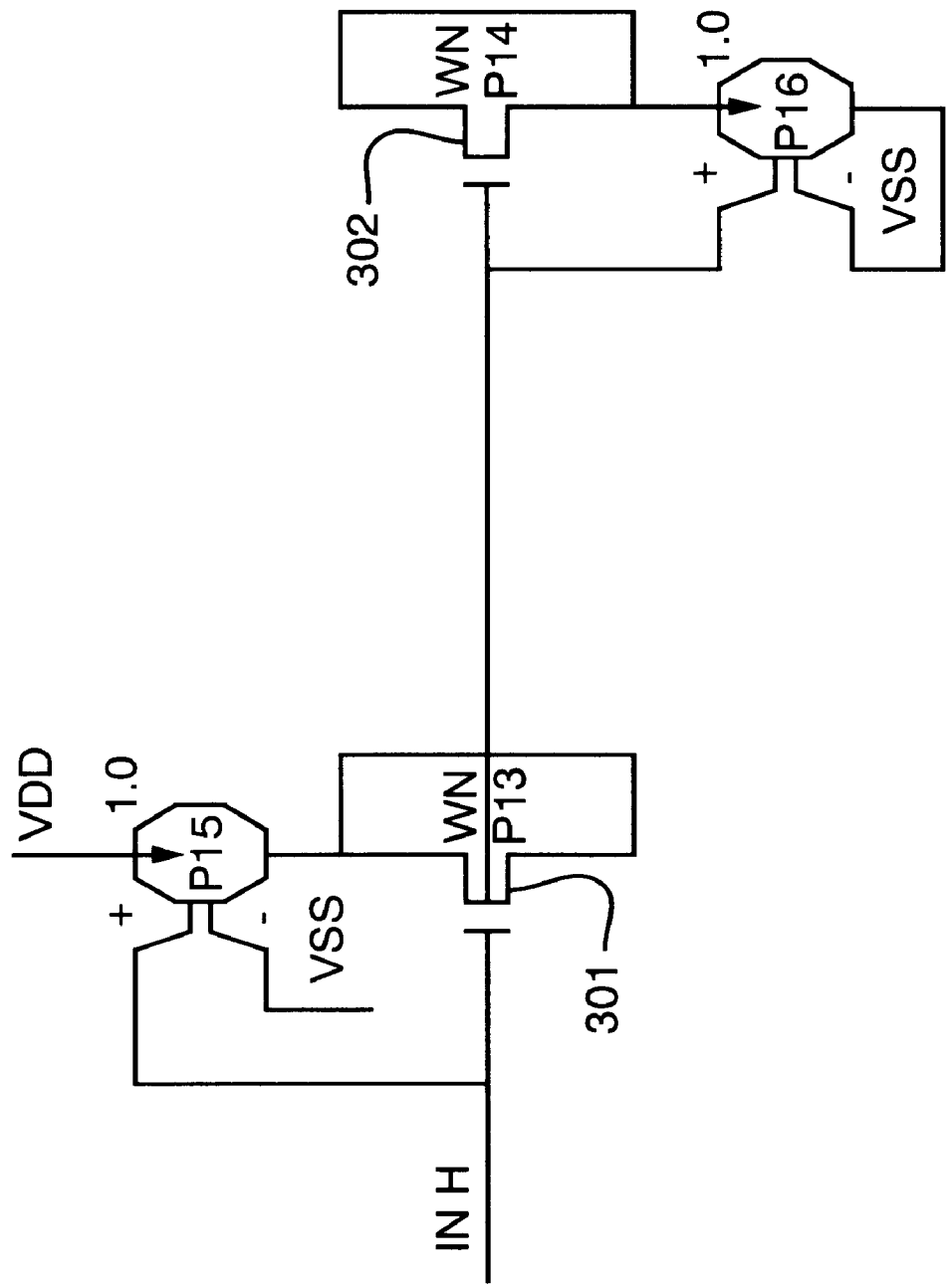
FIG. 4 illustrates a structure for a model of a DCVSL circuit according to a first embodiment of the present invention.

FIG. 4 illustrates a model according to a first embodiment of the present invention. In this model, the source/drain pair for each of the MOS devices 301, 302 switches in opposite directions. This model can be used to determine the capacitance for either a rising or falling input.

Figure 5A:
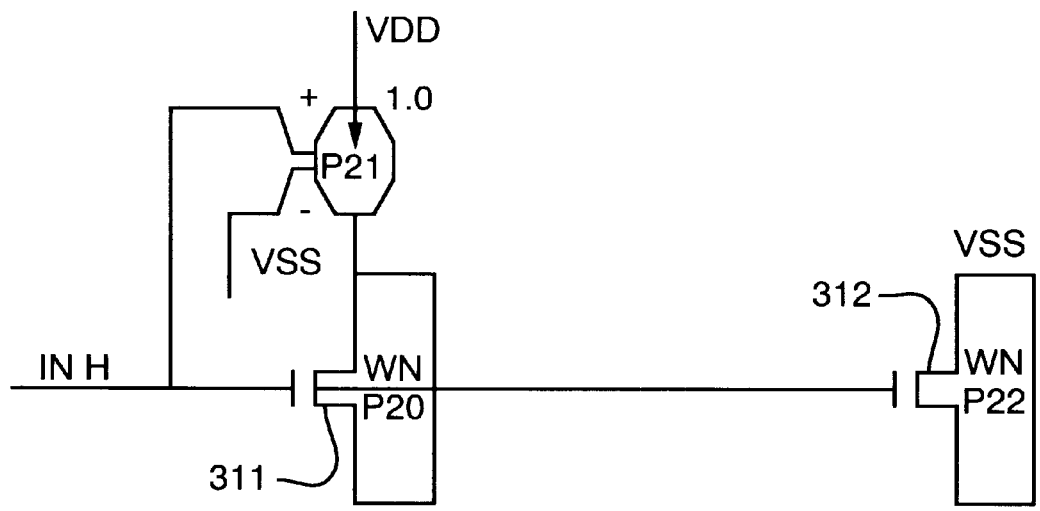
FIGS. 5A and 5B illustrate a structure for a model of a DCVSL circuit according to a second embodiment of the present invention, when a rising input is considered.
Figure 5B:
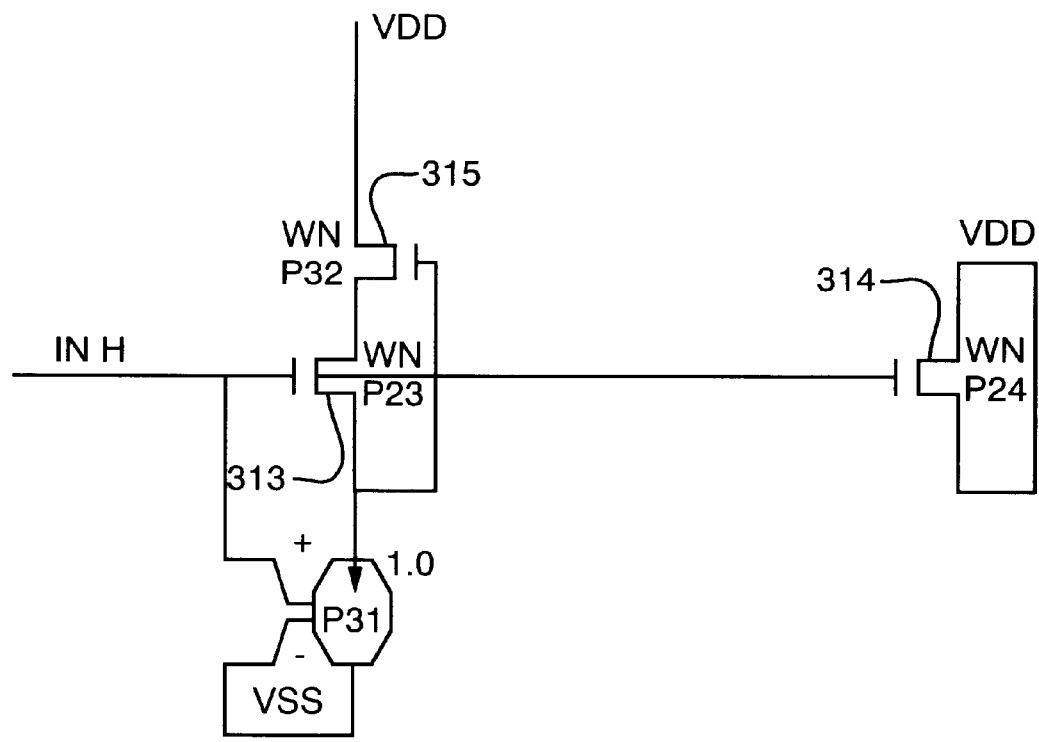

FIGS. 5A–5B represent the models to use with a rising input according to a second embodiment of the present invention. With the rising input, the maximum capacitance can be determined by having the source/drain of the MOS device 311 falling and the source/drain of device 312 being held constant at VSS. The minimum capacitance (FIG. 5B) is determined by having the source/drain of the MOS device 313 rising and the source/drain of the MOS device 314 being held at VDD. The body effect is modeled by adding a MOS device 315 at the source 313.

Figure 6A:
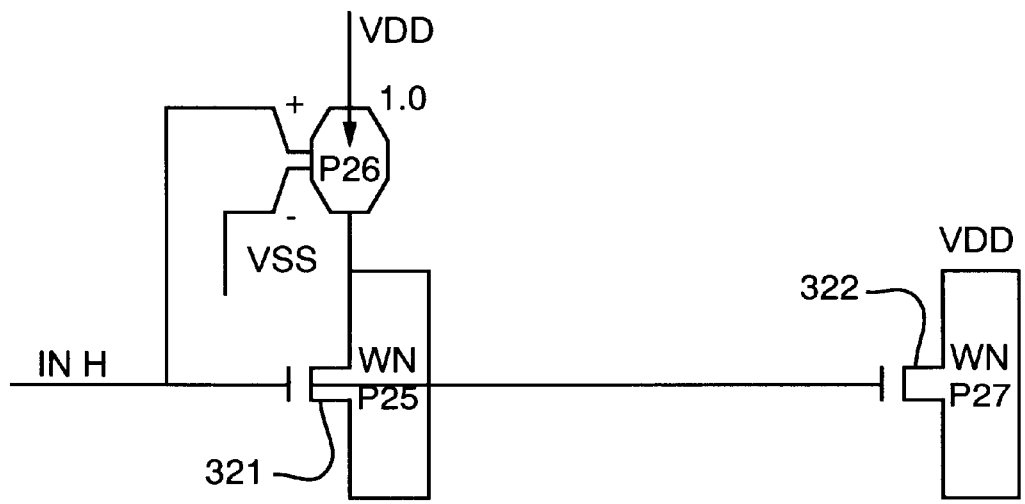
FIGS. 6A and 6B illustrate a structure for a model of a DCVSL circuit according to a second embodiment of the present invention, when a falling input is considered.
Figure 6B:
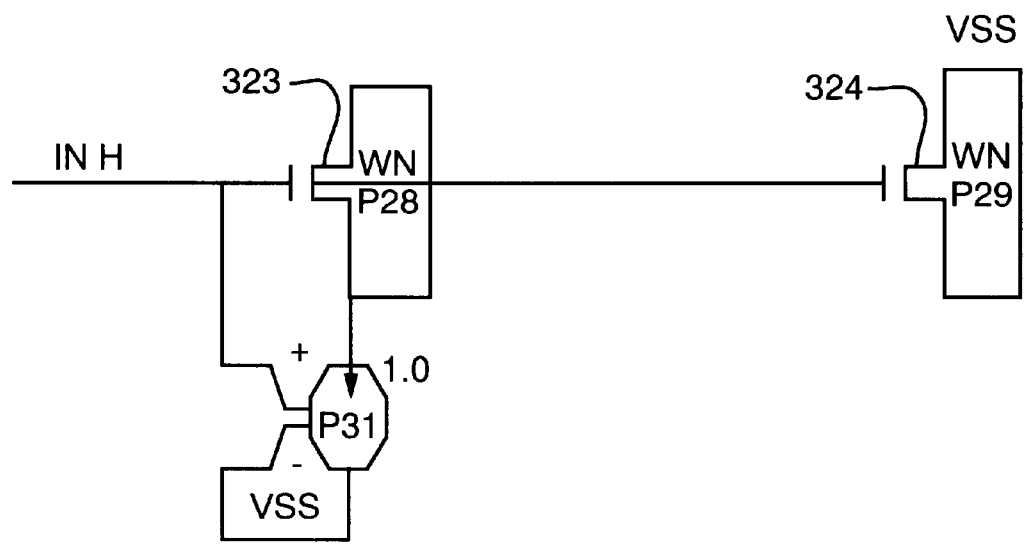

When the input IN_H is falling, the models according to the second embodiment correspond to FIGS. 6A and 6B. FIG. 6A represents the maximum capacitance model in which one of the devices 321 is rising and the other device 322 is held at VDD. FIG. 6B represents a model for the minimum capacitance in which one of the devices 323 is falling and the other device 324 is held at VSS.

After the model type is selected for the specific DCVSL circuit at issue, the maximum and minimum capacitances are determined at step 230 (FIG. 3). The capacitances for each of the individual MOS devices was previously determined at step 200. The capacitance for the entire structure is determined by combining the individual capacitances which correspond to the selected model. Thus, in the first embodiment applying the model of FIG. 4, the capacitance for a rising source/drain pair with a falling input is used for one MOS device and the capacitance for a falling source/drain pair with a falling input is used for the other MOS device. The capacitances for both of these devices is summed to determine the capacitance for the entire structure. For a symmetrically sized DCVSL circuit, it doesn't matter which device corresponds to each device in the model. However, if the DCVSL circuit is asymmetrically sized, the larger width device is used as the device which switches in the opposite direction to the input signal for a maximum capacitance and as the device which switches in the same direction as the input signal for minimum capacitance.

The first embodiment is a simplified model which ignores several effects in the DCVSL circuit. First, it ignores a body effected source/drain pair in one of the devices. It also ignores the possibility of a time delay in the switching of the source/drain nodes. However, it provides a better representation than the models previously used and it is less complex than the second embodiment.

In the second embodiment, the capacitances are determined in a manner similar to the first embodiment. The capacitance values for each of the MOS devices under the respective conditions in the model, as calculated in step 200, are applied within the model. Thus, as illustrated in FIG. 5A, the maximum model has one source/drain pair 311 falling with a rising input and the other 312 held to VSS since it would eventually rise. Holding it to VSS accounts for possible overlap current due to time delays in the switching of the source/drain nodes of 311 and 312. In FIG. 5B, the minimum model has one source/drain pair 313 rising with a rising input and the other 314 held to VDD since it would eventually fall. In addition for the minimum model, a body-effected model is used for the source/drain pair 313. In other words, a model for which the source does not rise to full VDD. The appropriate capacitances as determined in step 200 are combined according to the structures of the figures to determine the actual load in step 230. Similarly, for FIGS. 6A and 6B, with a falling input, the appropriate data use would be inserted for the MOS devices within the model. As with the first embodiment, with symmetrically sized DCVSL circuits, it does not matter which of the two devices is used as the rising/falling device and the other being held high or low. With asymmetrically sized DCVSL circuits, the larger device should be used as the switching source/drain pair since it would have the most significant effect on the total load capacitance.

As illustrated in FIG. 3, steps 220 and 230 are repeated for every DCVSL circuit located at step 210 within the circuit. In this manner, appropriate load capacitances can be determined for the specific structures within the circuit. These load capacitances can be used in determining the delays within the timing verifier. The delays can be determined using various known estimators of delay, including Elmore delay models. Since the method of the present invention provides more accurate modeling of loading on signals for the timing verification, the number of false errors is reduced.

The first and second embodiments of the present invention have been described above in terms of calculating capacitances of individual MOS devices under certain conditions and then combining them in a structure applicable to the DCVSL circuit. Alternatively, since the capacitances of the MOS devices are determined by running simulations under certain configurations, the configurations could be in configurations for DCVSL circuits. Thus, a configuration corresponding to the desired model (FIGS. 4, 5A, 5B, 6A and 6B) could be used in the simulations with different width and length MOS devices. In such a situation, the appropriate values from the simulations need only be applied when the DCVSL circuit is encountered. However, this would increase the time for the simulations and determining of capacitances in general.

Having thus described at least one embodiment, alterations, modifications and changes to the invention would be readily apparent to those of skill in this industry. Such modification and changes are intended to be within the scope of the invention which is only limited by the claims appended here too.

What is claimed is:

1. A method of estimating charges within a DCVSL structure which includes a plurality of different MOS devices, the method comprising the steps of:

(A) determining a gate capacitance of each of the MOS devices that comprise the DCVSL structure by using circuit models that simulate a set of signals including signals at a gate, a source and a drain of each of said MOS devices, and selecting at least one simplified DCVSL model to account for the complementary switching behavior of a DCVSL structure, and after determining the gate capacitance of each individual MOS device, performing an estimating step, including:

(i) estimating a maximum charge based upon one DCVSL model;

(ii) estimating a minimum charge based upon another DCVSL model;

(iii) estimating a charge corresponding to a rising gate input based upon one DCVSL model by determining a maximum capacitance by having the source/drain of a first MOS device falling and the source/drain of a paired MOS device being held constant VSS, and by determining a minimum capacitance by having the source/drain of said first MOS device rising and the source/drain of the paired MOS device being held at VDD; and (B) combining said gate capacitance for each individual MOS device to determine the gate capacitance of the DCVSL structure.

2. A method of estimating charges within a DCVSL structured which includes a plurality of different MOS devices, the method comprising the steps of:

(A) determining a gate capacitance of each of the MOS devices that comprise the DCVSL structure by using circuit models that simulate a set of signals including signals at a gate, a source and a drain of each of said MOS devices;

(B) combining said gate capacitance for each individual MOS device to determine the gate capacitance of the DCVSL structure;

(C) selecting as a circuit model for the DCVSL structure, a model that includes at least one of the MOS devices having a source/drain pair that switches in the same direction as an input voltage, and another MOS device having a source/drain pair that switches in the opposite direction as the input voltage; and (D) in an asymmetrically sized circuit, providing said circuit model that switches the MOS device with a larger width opposite to the direction of the input signal for determining a maximum capacitance, and in the same direction as the input signal for determining a minimum capacitance.

3. A method of estimating charges within a DCVSL structure which structure includes a plurality of different MOS devices, the method comprising the steps of:

(A) determining a gate capacitance of each of the MOS devices that comprise the DCVSL structure by using circuit models that simulate a set of signals including signals at a gate, a source and a drain of each of said MOS devices, and selecting at least one simplified DCVSL model to account for the complementary switching behavior of a DCVSL structure, and after determining the gate capacitance of each individual MOS device, performing an estimating step, including:

(i) estimating a maximum charge based upon one DCVSL model;

(ii) estimating a minimum charge based upon another DCVSL model;

(iii) estimating a charge corresponding to a falling gate input based upon one DCVSL model by determining a maximum capacitance by having the source/drain of a first MOS device rising and the source/drain of a paired MOS device being held constant at VDD, and by determining a minimum capacitance by having the source/drain pair of said first MOS device falling and the source/drain of the paired MOS device being held constant at VSS; and (B) combining said gate capacitance for each individual MOS device to determine the gate capacitance of the DCVSL structure.

* * * * *